US012587771B2

(12) United States Patent
Chang

(10) Patent No.: US 12,587,771 B2
(45) Date of Patent: Mar. 24, 2026

(54) ELECTRONIC DEVICE HAVING SPEAKER MODULE AND MICROPHONE

(71) Applicant: Wistron Corporation, New Taipei City (TW)

(72) Inventor: Tzu-Ting Chang, New Taipei City (TW)

(73) Assignee: Wistron Corporation, New Taipei City (TW)

( * ) Notice: Subject to any disclaimer, the term of this patent is extended or adjusted under 35 U.S.C. 154(b) by 401 days.

(21) Appl. No.: 18/161,893

(22) Filed: Jan. 31, 2023

(65) Prior Publication Data

US 2024/0147103 A1 May 2, 2024

(30) Foreign Application Priority Data

Oct. 26, 2022 (TW) .................................. 111140663

(51) Int. Cl.
*H04R 1/04* (2006.01)
*H04R 1/08* (2006.01)
*H04R 1/28* (2006.01)
*H05K 1/181* (2026.01)

(52) U.S. Cl.
CPC .............. *H04R 1/04* (2013.01); *H04R 1/083* (2013.01); *H04R 1/288* (2013.01); *H05K 1/181* (2013.01)

(58) Field of Classification Search
CPC ........... H04R 1/04; H04R 1/083; H04R 1/288
See application file for complete search history.

(56) References Cited

U.S. PATENT DOCUMENTS

| | | | |
|---|---|---|---|
| 10,932,074 B2 | 2/2021 | Hsu et al. | |
| 2018/0098143 A1* | 4/2018 | Silvestri | H04R 1/02 |
| 2020/0273478 A1* | 8/2020 | Park | H04R 1/04 |
| 2020/0413209 A1 | 12/2020 | Hsu et al. | |
| 2021/0099779 A1 | 4/2021 | Tang et al. | |
| 2023/0217152 A1* | 7/2023 | Park | H04R 1/083 |
| | | | 381/374 |
| 2024/0058692 A1* | 2/2024 | Morita | A63F 13/215 |

FOREIGN PATENT DOCUMENTS

| | | |
|---|---|---|
| CN | 113873375 | 12/2021 |
| TW | M586500 | 11/2019 |
| TW | 202101240 | 1/2021 |

OTHER PUBLICATIONS

"Office Action of Taiwan Counterpart Application", issued on Oct. 27, 2023, p. 1-p. 5.

* cited by examiner

*Primary Examiner* — Suhan Ni
(74) *Attorney, Agent, or Firm* — JCIPRNET

(57) ABSTRACT

A smart speaker includes an outer casing, a speaker module, and a microphone module is provided. The outer casing includes a first housing and a second housing assembled to each other. The speaker module is disposed in the first housing. The microphone module includes a circuit board and at least one microphone. The circuit board is assembled to the second housing and separated from the first housing. The microphone is disposed on the circuit board.

13 Claims, 13 Drawing Sheets

180(115)

114 ⎤
110
112 ⎦

130(115)

122 ⎤
120(115)
124 ⎦

100

180(115)

130(115)

140(115)

114

110

112

122

120(115)

124

100

1141         114(110)

150(115)

112(110)

ELECTRONIC DEVICE HAVING SPEAKER MODULE AND MICROPHONE

CROSS-REFERENCE TO RELATED APPLICATION

This application claims the priority benefit of Taiwan application serial no. 111140663, filed on Oct. 26, 2022. The entirety of the above-mentioned patent application is hereby incorporated by reference herein and made a part of this specification.

BACKGROUND

Technical Field

The disclosure relates to an electronic device, and in particular, relates to a smart speaker with a speaker module and a microphone.

Description of Related Art

In recent years, many technology manufacturers and audio manufacturers have launched smart speaker products equipped with intelligent voice assistants. The so-called smart speaker is a home appliance product with wireless voice control function. There are even models that connect the intelligent voice assistant to the remote control of home appliances, realizing a new intelligent life that only requires speech and not hands.

The smart speaker usually includes a microphone and a speaker module. The microphone is for receiving the user's voice control audio, and the speaker module is for cooperating with the intelligent voice assistant to emit an anthropomorphic voice. The microphone and the speaker module of the smart speaker are mostly assembled in the same housing, and the speaker box of the speaker module vibrates inevitably during operation. The vibration is easily transmitted through the housing and affects the microphone's audio-receiving effect.

SUMMARY

The disclosure provides a smart speaker, which helps to avoid excessive vibration of the speaker module affecting the audio-receiving effect of the microphone.

The smart speaker of the disclosure includes an outer casing, a speaker module, and a microphone module. The outer casing includes a first housing and a second housing assembled to each other; The speaker module is disposed in the first housing. The microphone module includes a circuit board and at least one microphone. The circuit board is assembled in the second housing and separated from the first housing. The microphone is disposed on the circuit board.

In an embodiment of the disclosure, the circuit board includes an upper surface and a lower surface opposite to each other, the lower surface faces the speaker module, and the microphone is disposed on the lower surface.

In an embodiment of the disclosure, the smart speaker includes at least one cushioning component. The cushioning component is disposed between the second housing and the first housing.

In an embodiment of the disclosure, the second housing includes multiple assembling portions and is assembled in the first housing by the assembling portions. A number of the cushioning component is multiple, and the cushioning components correspond respectively to the assembling portions.

In an embodiment of the disclosure, the assembling portions surround the circuit board.

In an embodiment of the disclosure, the cushioning component supports the second housing above the first housing in a perpendicular direction, thereby increasing a distance between the microphone and the speaker module in the perpendicular direction.

In an embodiment of the disclosure, the speaker module includes a speaker box and a speaker, and the speaker is disposed in the speaker box.

In an embodiment of the disclosure, the smart speaker includes a cushioning component. The cushioning component is disposed between the speaker box and the speaker.

In an embodiment of the disclosure, the speaker includes a speaker body and an extending portion. The extending portion extends along a periphery of the speaker body. The cushioning component is disposed between the extending portion and the speaker box and surrounds the speaker body.

In an embodiment of the disclosure, the cushioning component supports the speaker box above the speaker in a perpendicular direction, thereby increasing a distance between the microphone module and the speaker in the perpendicular direction.

In an embodiment of the disclosure, the smart speaker includes a cushioning component. The cushioning component is disposed between the speaker box and the first housing.

In an embodiment of the disclosure, the cushioning component surrounds the speaker.

In an embodiment of the disclosure, the smart speaker includes an image capturer. The image capturer is disposed in the second housing.

The smart speaker of the disclosure includes an outer casing, a speaker module, and a microphone module. The speaker module is disposed in the first housing. The microphone module is assembled in the second housing and separated from the first housing.

In an embodiment of the disclosure, the microphone module includes a circuit board and at least one microphone. The circuit board is assembled in the second housing and separated from the first housing. The circuit board includes an upper surface and a lower surface opposite to each other. The lower surface faces the speaker module. The at least one microphone is disposed on the lower surface.

In an embodiment of the disclosure, the speaker module includes a speaker box and a speaker, and the speaker is disposed in the speaker box.

In an embodiment of the disclosure, the electronic module includes a cushioning component. The cushioning component is disposed between the speaker box and the speaker.

In an embodiment of the disclosure, the speaker includes a speaker body and an extending portion. The extending portion extends along a periphery of the speaker body. The cushioning component is disposed between the extending portion and the speaker box and surrounds the speaker body.

In an embodiment of the disclosure, the cushioning component supports the speaker box above the speaker in a perpendicular direction, thereby increasing a distance between the microphone module and the speaker in the perpendicular direction.

In an embodiment of the disclosure, the electronic module includes a cushioning component. The cushioning component is disposed on a bottom portion of the speaker box.

DESCRIPTION OF THE EMBODIMENTS

Figure 1:
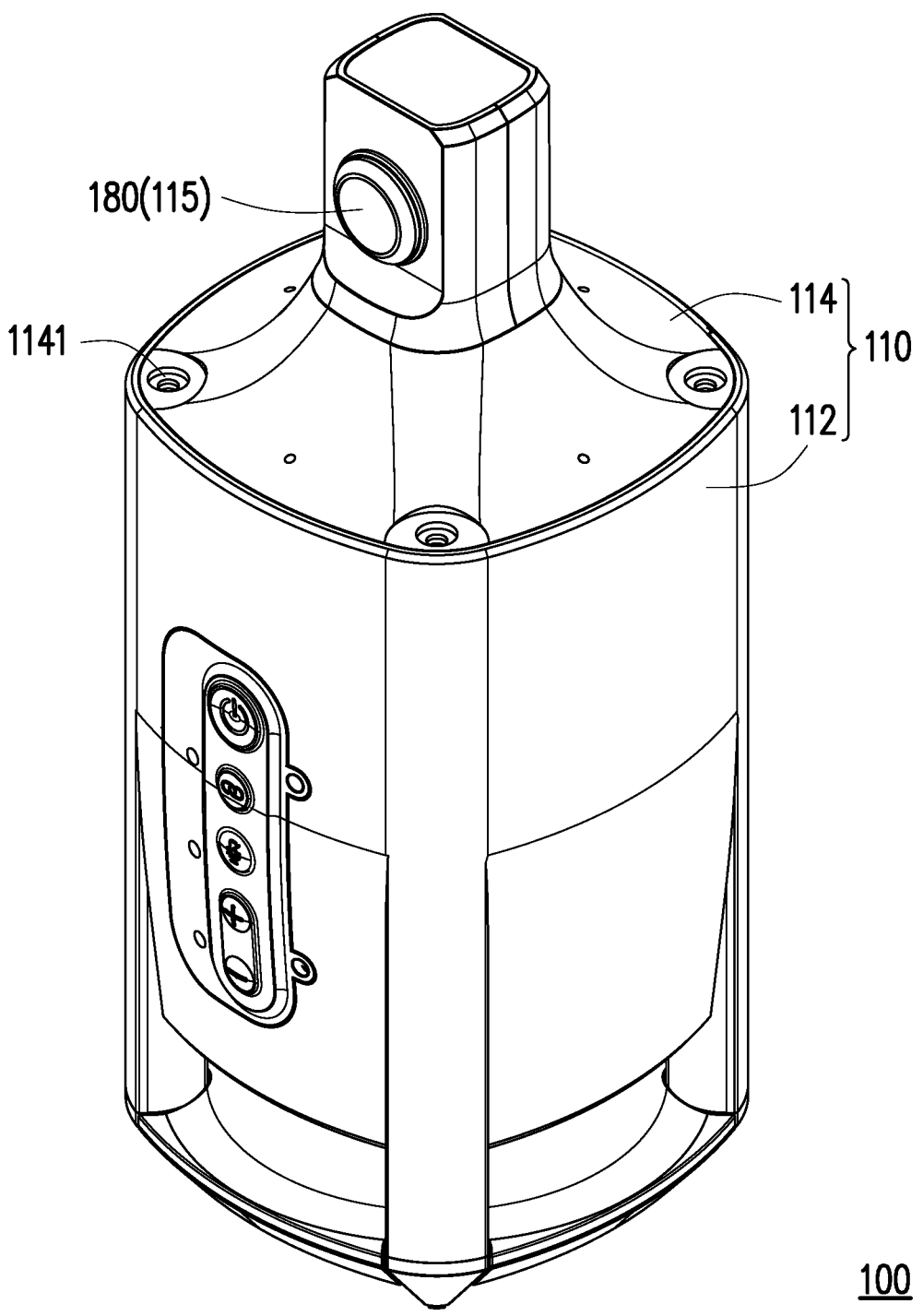
FIG. 1 is a perspective view of a smart speaker of an embodiment of the disclosure.
Figure 2:
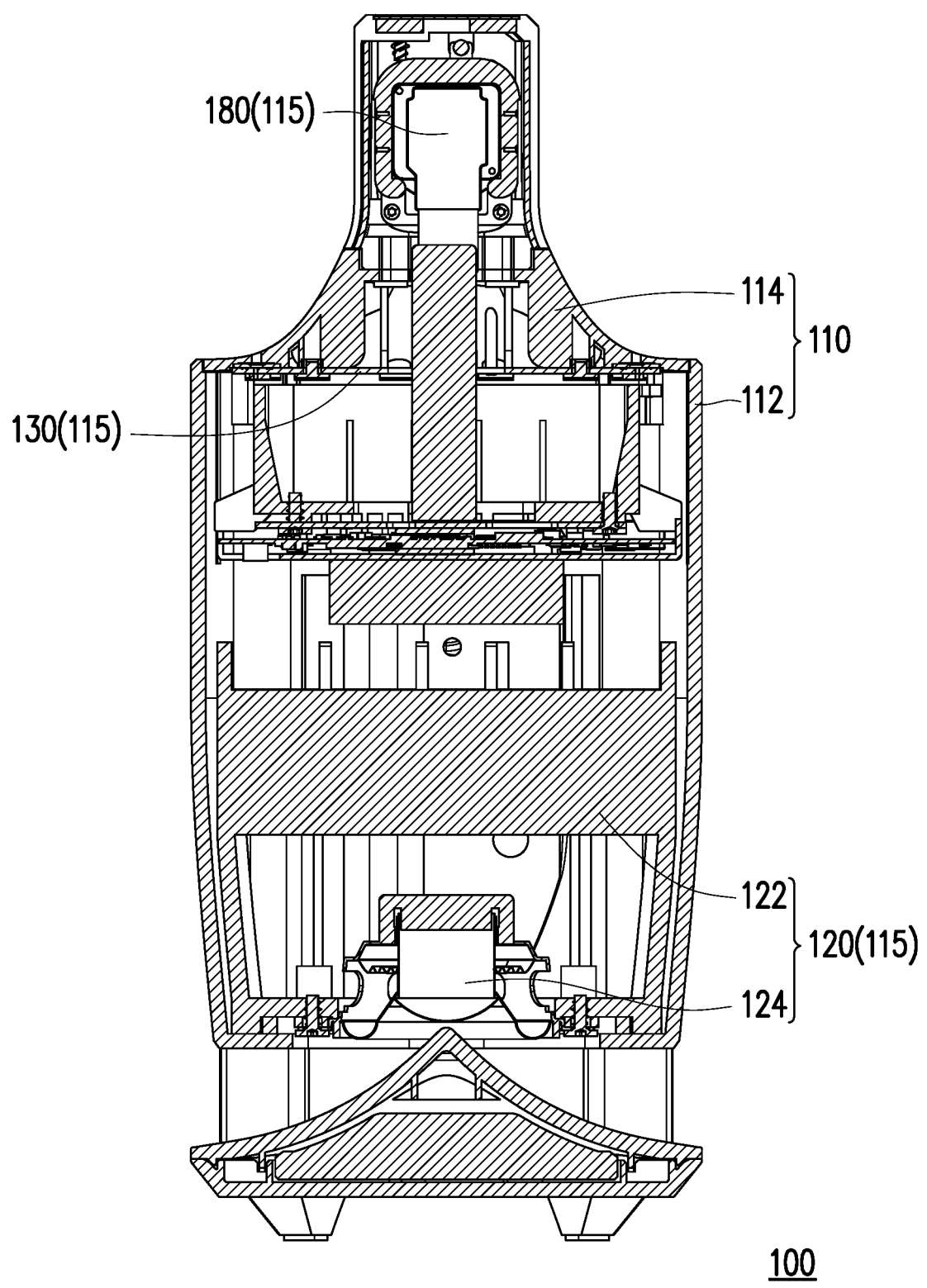
FIG. 2 is a cross-sectional view of the smart speaker of FIG. 1.
Figure 3:
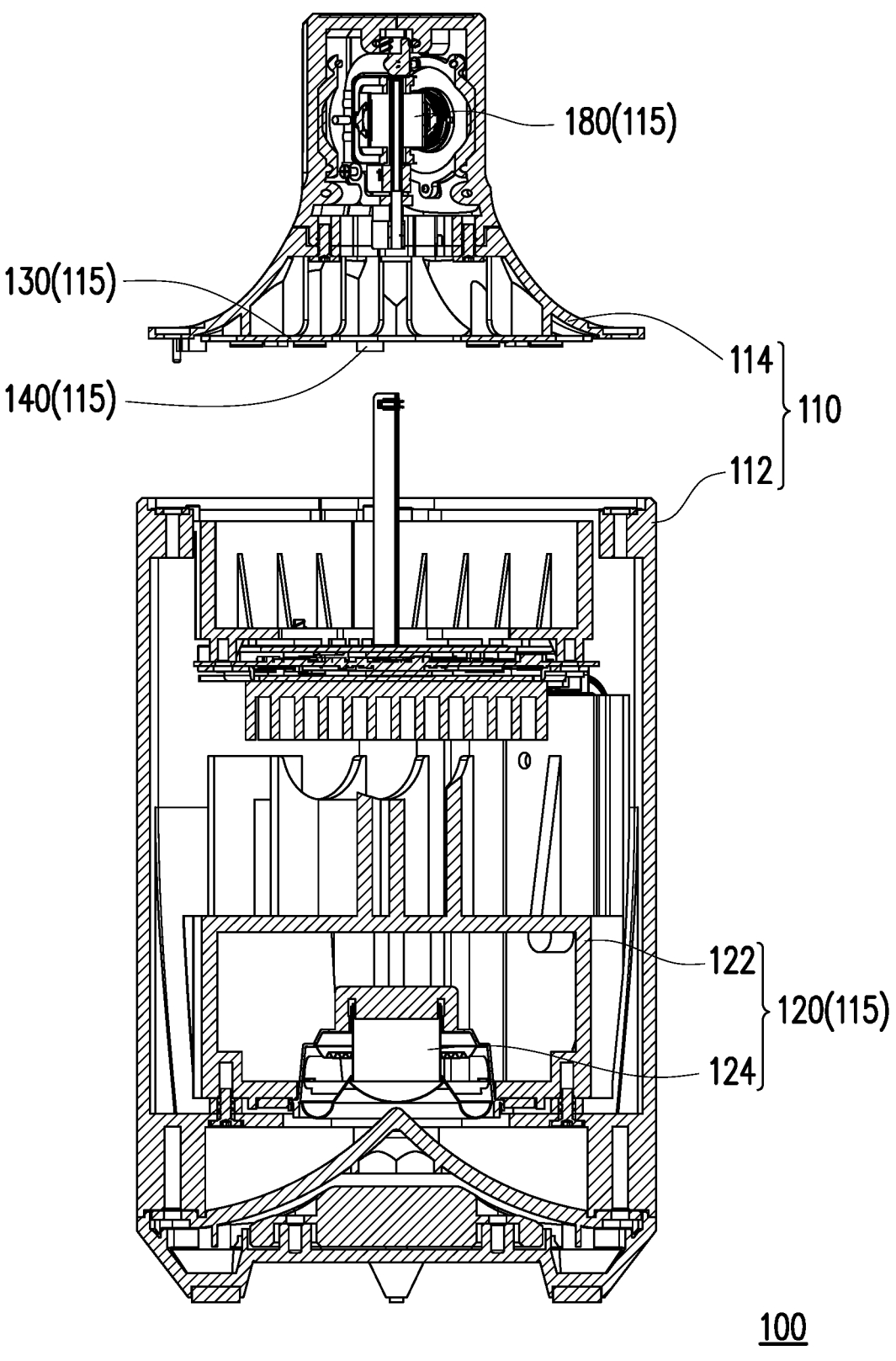
FIG. 3 shows that the second housing of FIG. 2 is separated from the first housing.

FIG. 1 is a perspective view of a smart speaker of an embodiment of the disclosure. FIG. 2 is a cross-sectional view of the smart speaker of FIG. 1. FIG. 3 shows that the second housing of FIG. 2 is separated from the first housing. Referring to FIG. 1 to FIG. 3, the smart speaker 100 of the embodiment includes an outer casing 110 and an electric module 115. The electric module 115 includes a speaker module 120 and a microphone module. The microphone module includes a circuit board 130 and at least one microphone 140. The outer casing 110 includes a first housing 112 and a second housing 114 assembled to each other. The first housing 112 is, for example, a main housing of the smart speaker 100, and the second housing 114 is, for example, an upper cover of the smart speaker 100. The speaker module 120 is disposed in the first housing 112 and includes a speaker box 122 and a speaker 124. The speaker 124 is disposed in the speaker box 122. It can be clearly seen from FIG. 2 and FIG. 3 that the circuit board 130 of the microphone module is assembled in the second housing 114 instead of the first housing 112 (i.e., the circuit board 130 of the microphone module is separated from the first housing 112). The microphone 140 is disposed on the circuit board 130, and the circuit board 130 is coupled to the microphone 140 and the speaker 124 of the speaker module 120.

As mentioned above, the microphone module including the microphone 140 and the circuit board 130 is assembled in the second housing 114 instead of the first housing 112. Thus, in response to the speaker module 120 disposed in the first housing 112 being actuated, which vibrates the speaker box 122, the vibration is not directly transmitted to the microphone 140 of the microphone module through the first housing 112. Thus, the audio-receiving effect of the microphone 140 is not affected by excessive vibration of the speaker box 122.

Figure 4A:
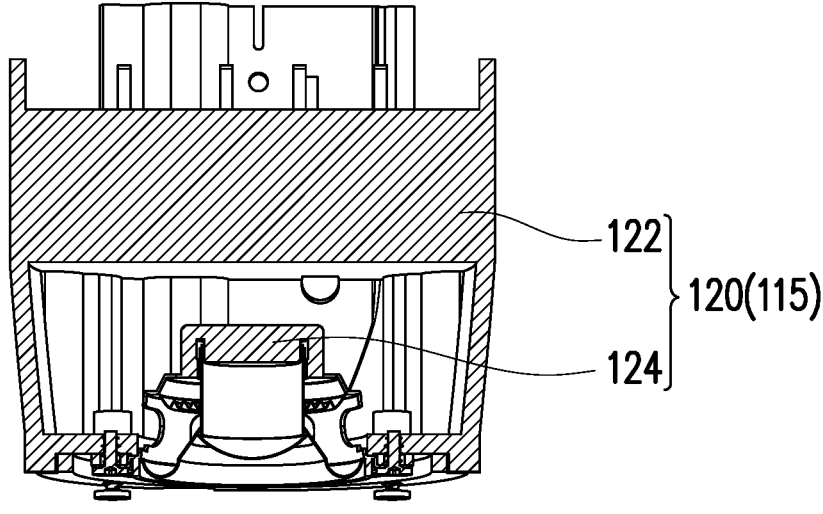
FIG. 4A and FIG. 4B shows the assembly flow of the smart speaker of FIG. 1.
Figure 4A:
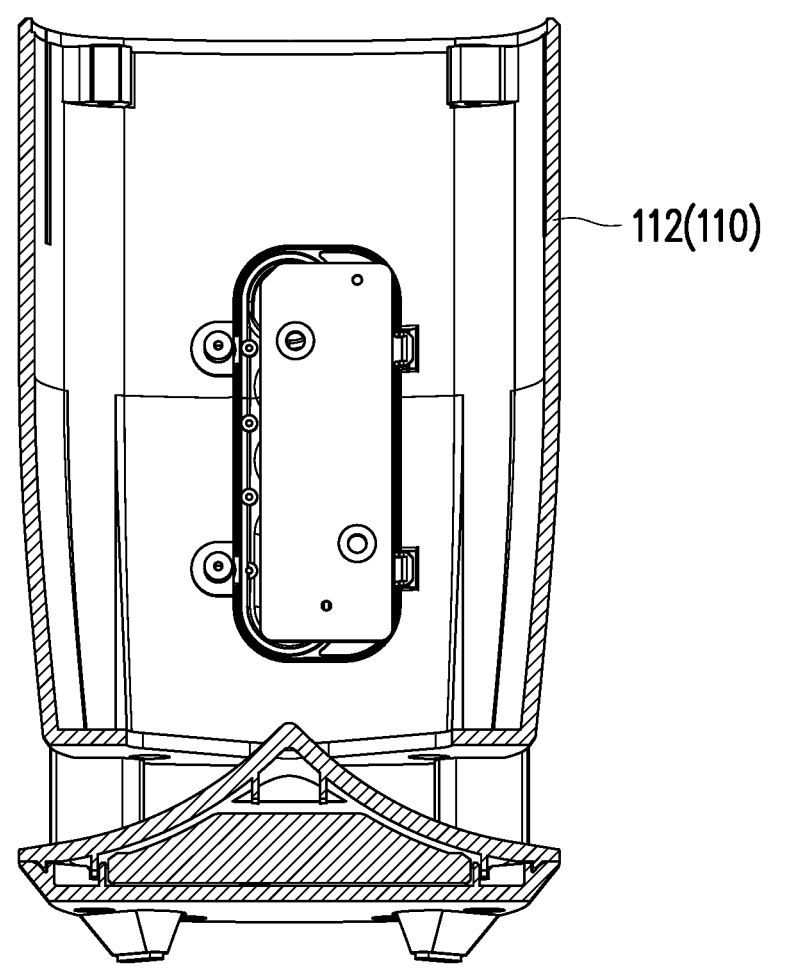
Figure 4B:
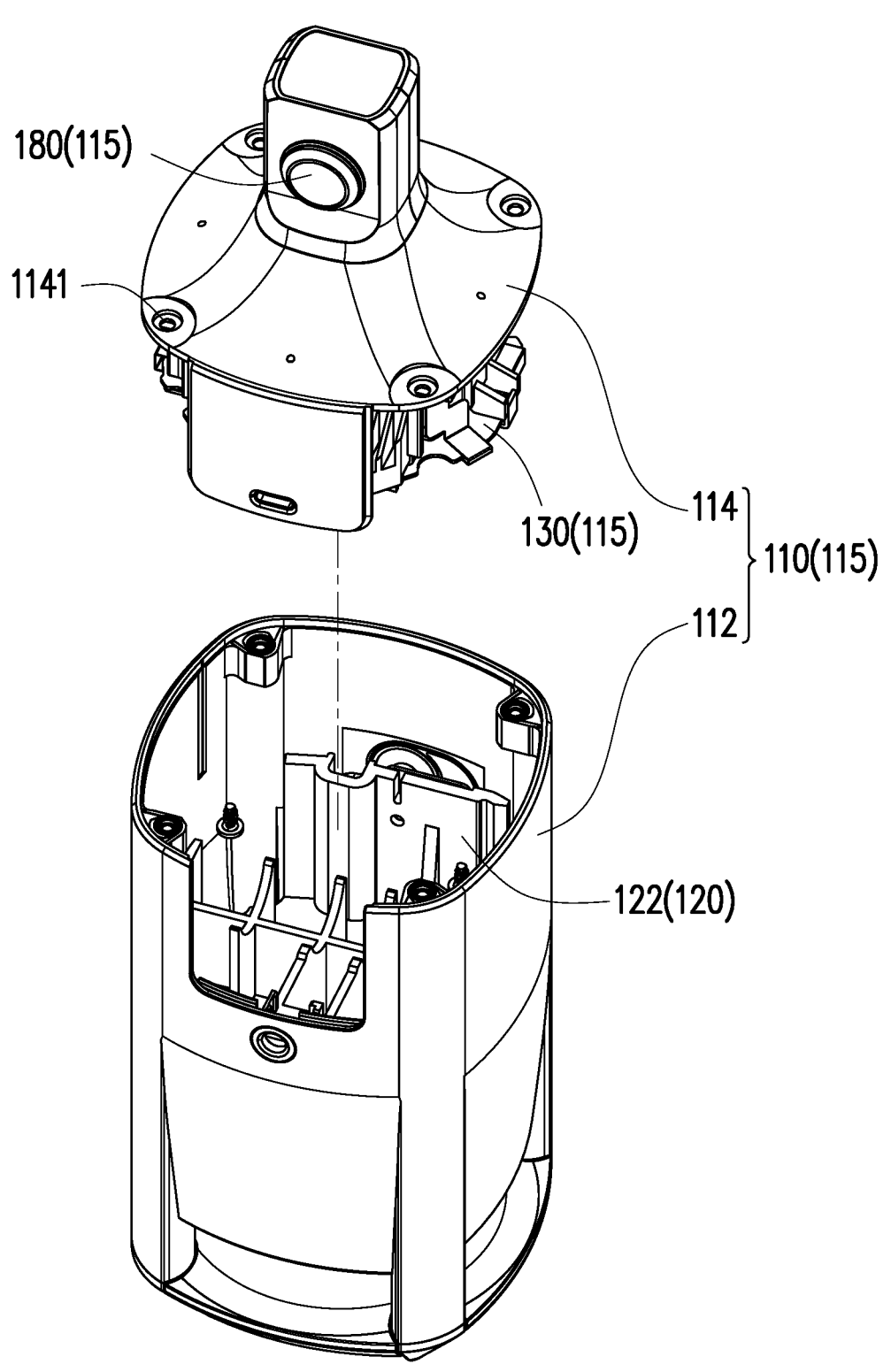

FIG. 4A and FIG. 4B shows the assembly flow of the smart speaker of FIG. 1. First, the speaker module 120 shown in FIG. 4A is assembled downward into the first housing 112. Next, the second housing 114 shown in FIG. 4B is assembled downward to the first housing 112, so that the circuit board 130 assembled in the second housing 114 is located in the first housing 112.

Figure 5:
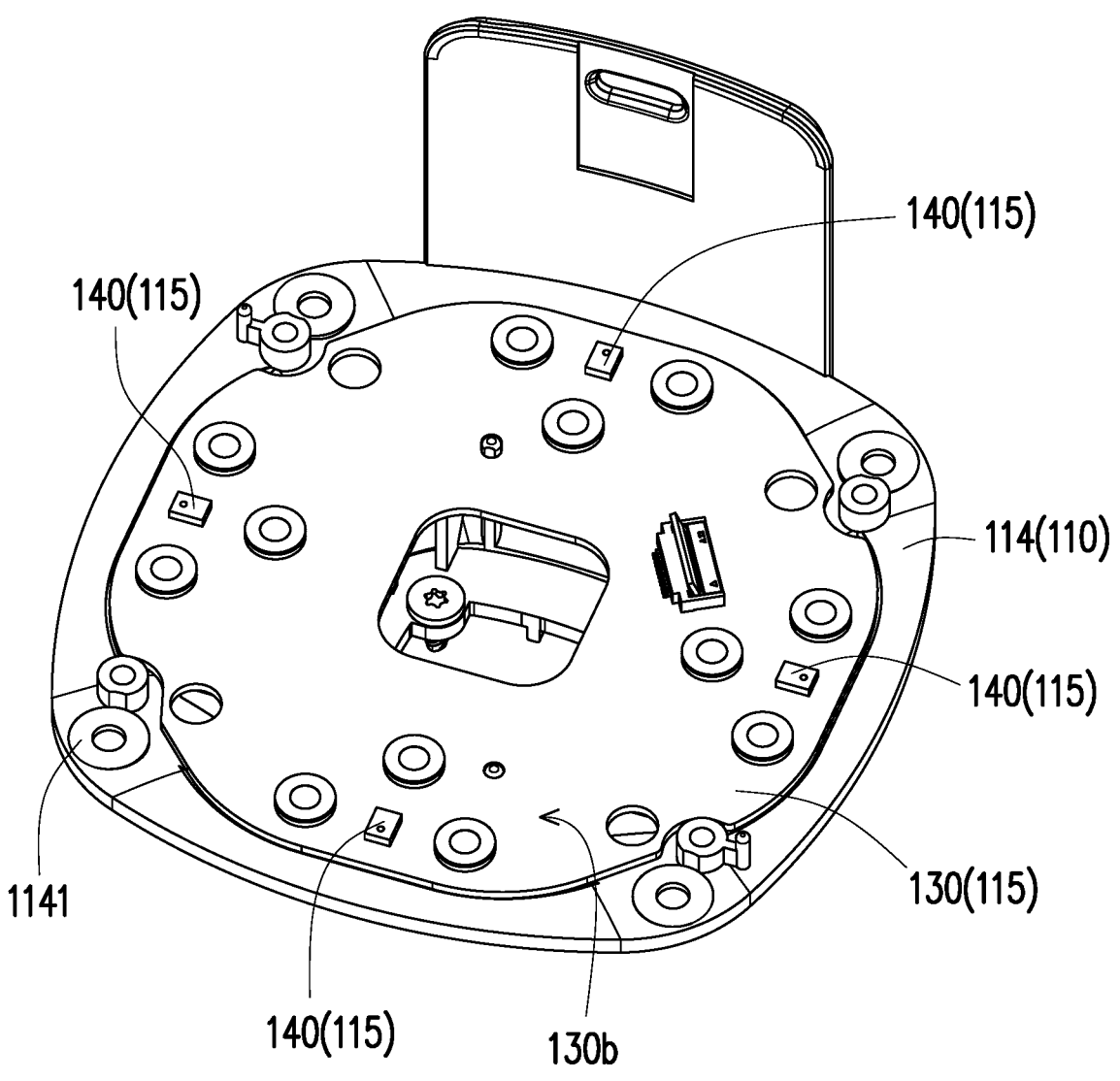
FIG. 5 is a perspective view of the second housing and the circuit board of FIG. 3 at another viewing angle.
Figure 6:
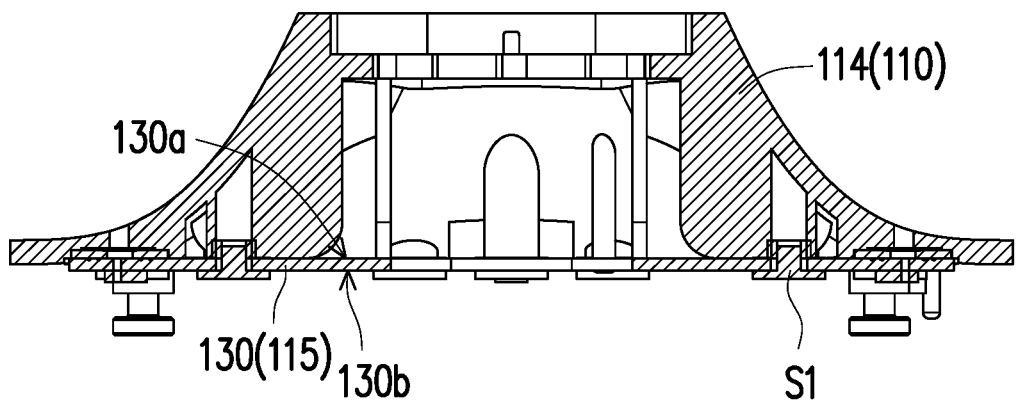
FIG. 6 is a cross-sectional view of the second housing and the circuit board of FIG. 5.

FIG. 5 is a perspective view of the second housing and the circuit board of FIG. 3 at another viewing angle. FIG. 6 is a cross-sectional view of the second housing and the circuit board of FIG. 5. Referring to FIG. 5 and FIG. 6, specifically, the circuit board 130 includes an upper surface 130a and a lower surface 130b opposite to each other. The upper surface 130a faces the second housing 114, and the lower surface 130b faces the speaker module 120. The circuit board 130 is locked to the second housing 114 by, for example, a fastener S1 (e.g., a screw), but the disclosure is not limited thereto. The microphone 140 is disposed on the lower surface 130b. Therefore, the microphone 140 is not located on the upper surface 130a of the circuit board 130 and does not interfere with the assembly of the upper surface 130a of the circuit board 130 and the second housing 114. It is more convenient to dispose a cushioning component, such as a rubber packing ring, between the upper surface 130a of the circuit board 130 and the second housing 114.

Figure 7:
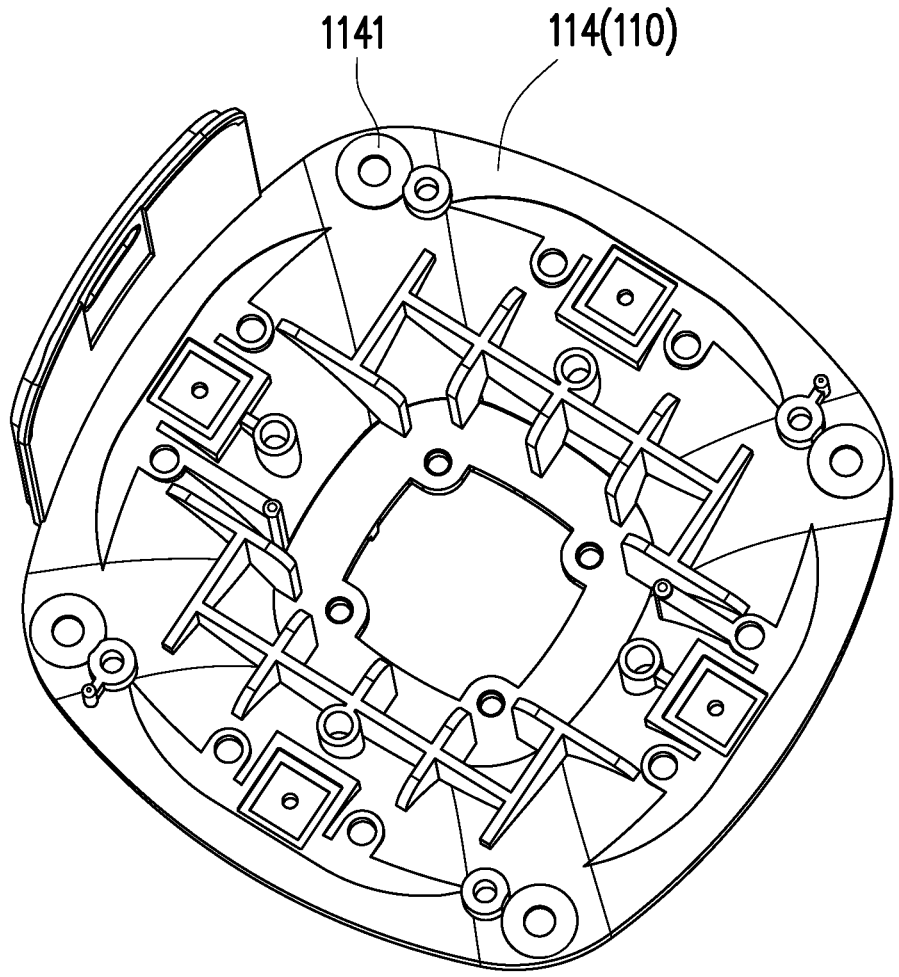
FIG. 7 is a perspective view of the second housing of FIG. 1.
Figure 8:
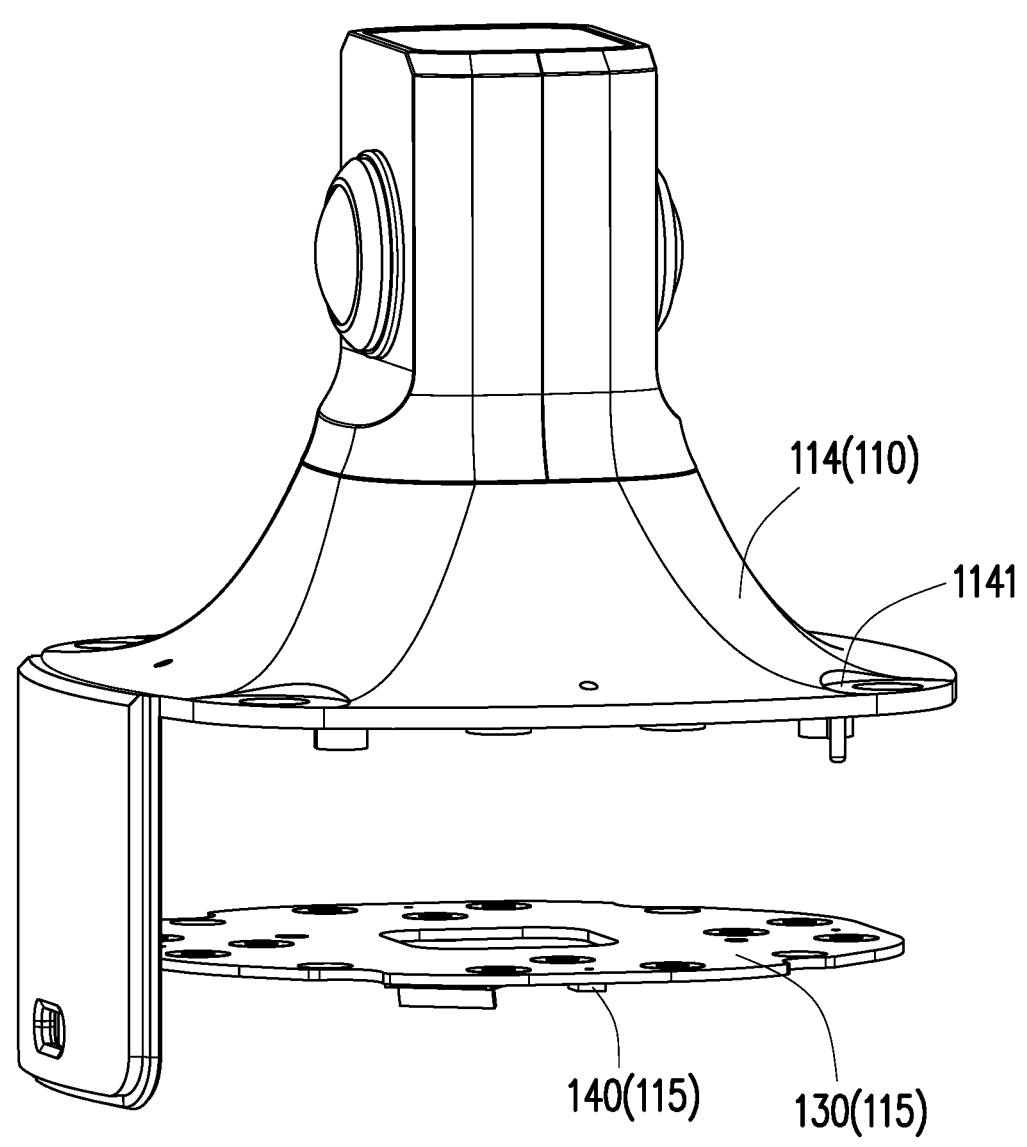
FIG. 8 is an exploded view of the second housing and the circuit board of FIG. 5.
Figure 9:
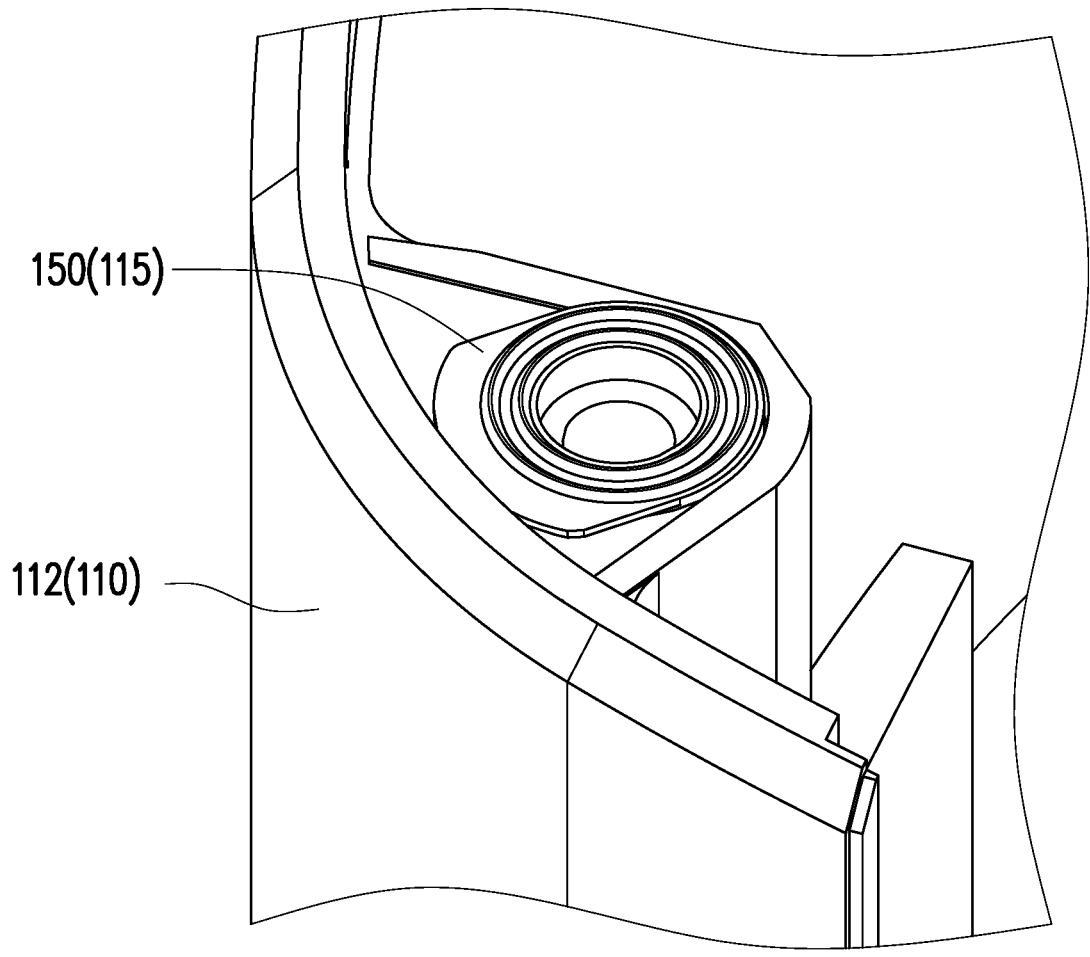
FIG. 9 is a partial enlarged view of the first housing of FIG. 4B.
Figure 10:
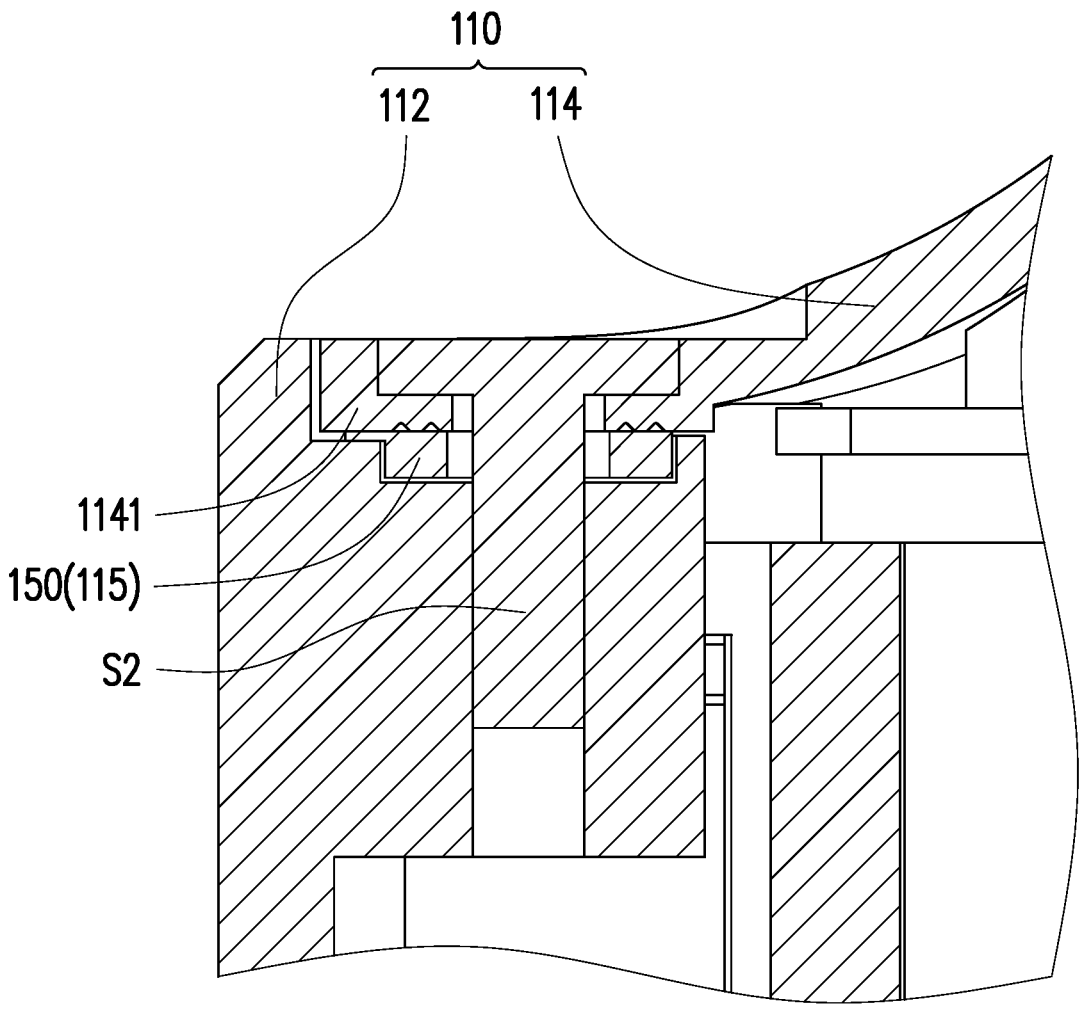
FIG. 10 shows a partial structure of the smart speaker of FIG. 1.

FIG. 7 is a perspective view of the second housing of FIG. 1. FIG. 8 is an exploded view of the second housing and the circuit board of FIG. 5. FIG. 9 is a partial enlarged view of the first housing of FIG. 4B. FIG. 10 shows a partial structure of the smart speaker of FIG. 1. Referring to FIG. 7 to FIG. 10, the second housing 114 of this embodiment includes multiple assembling portions 1141 and is assembled to the first housing 112 by the assembling portions 1141. The assembling portions 1141 surround the circuit board 130 and are locked to the first housing 112 by, for example, a fastener S2 (e.g., a screw), but the disclosure is not limited thereto. In addition, the electric module 115 of the smart speaker 100 of this embodiment further includes multiple cushioning components 150. The cushioning components 150 are disposed between the second housing 114 and the first housing 112 and correspond respectively to the assembling portions 1141, thereby providing a cushioning effect between the second housing 114 and the first housing 112 and reduce the impact of the vibration from the speaker box 122 on the microphone 140. Each of the cushioning components 150 is, for example, a rubber packing ring or other types of cushioning materials, which is not limited in the disclosure.

Figure 11:
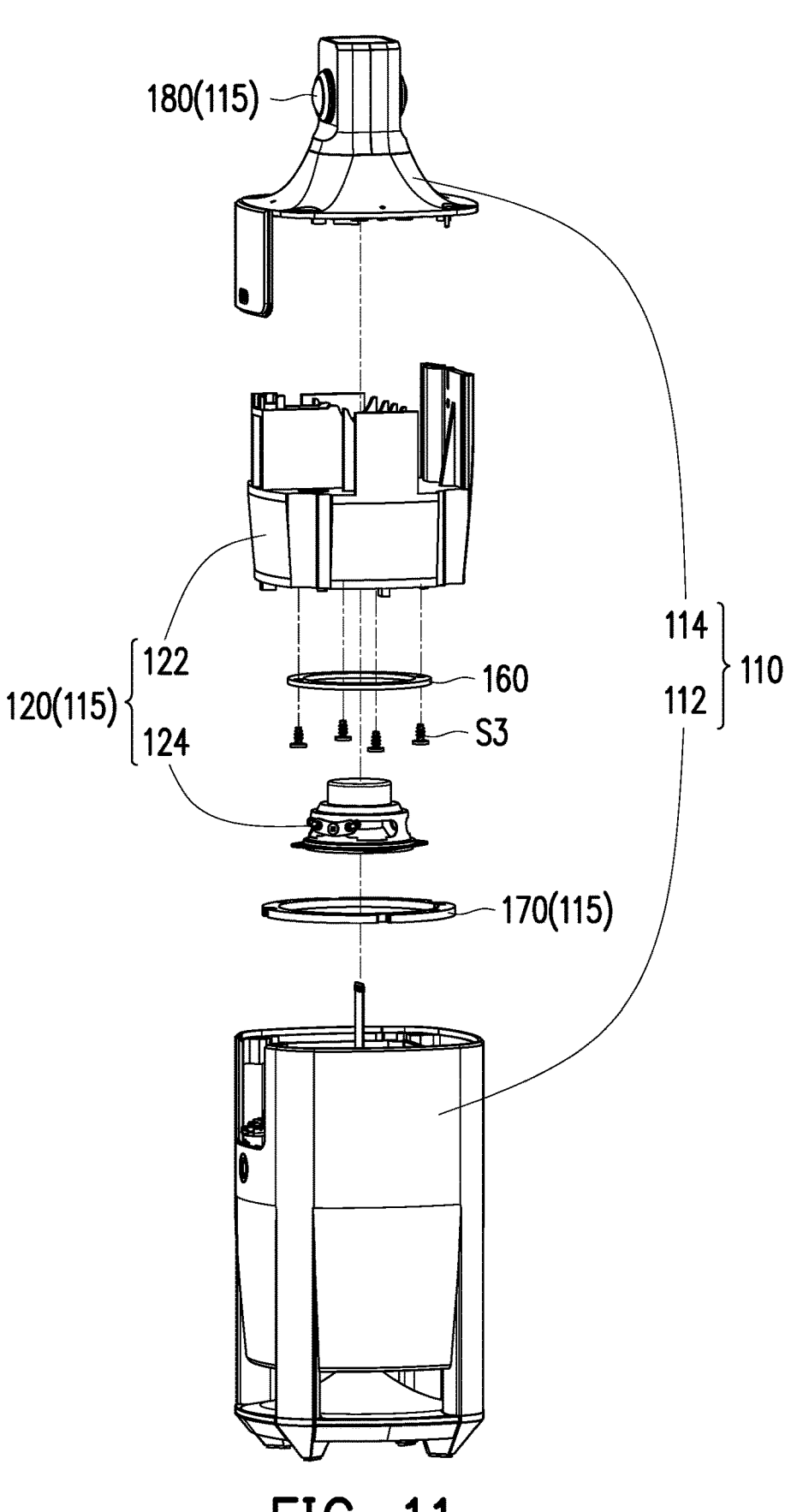
FIG. 11 is an exploded view of a part of the components of the smart speaker of FIG. 1.
Figure 12:
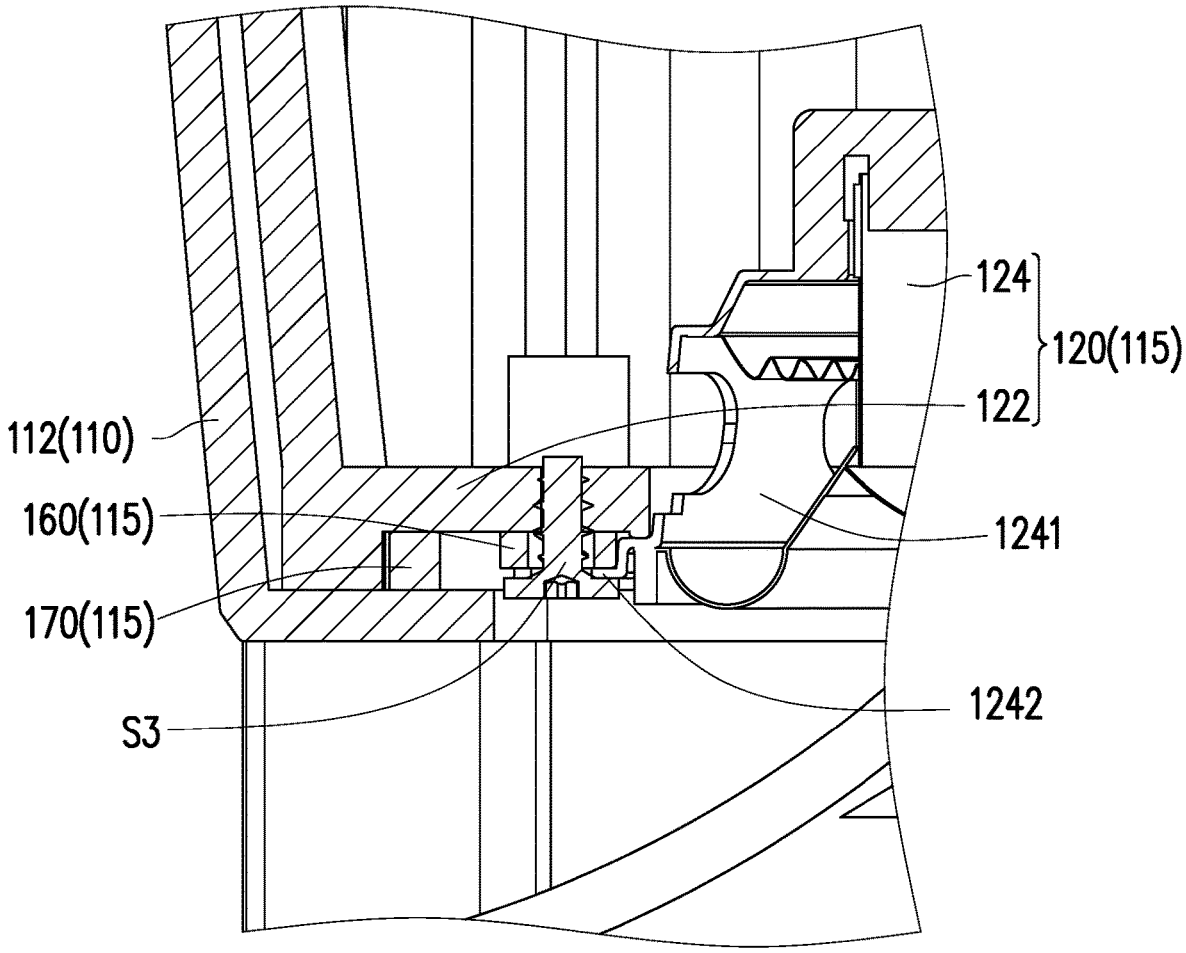
FIG. 12 is a partial enlarged view of the smart speaker of FIG. 2.

FIG. 11 is an exploded view of a part of the components of the smart speaker of FIG. 1. FIG. 12 is a partial enlarged view of the smart speaker of FIG. 2. Referring to FIG. 11 and FIG. 12, the electric module 115 of the smart speaker 100 of the embodiment further includes a cushioning component 160 and a cushioning component 170. The cushioning component 160 is disposed between the speaker box 122 and the speaker 124, and the cushioning component 170 is disposed on a bottom portion of the speaker box 122 and between the speaker box 122 and the first housing 112. The cushioning component 160 provides a cushioning effect between the speaker box 122 and the speaker 124, and the cushioning component 170 provides a cushioning effect between the speaker box 122 and the first housing 112 and reduces the impact of the vibration from the speaker box 122 on the microphone 140. The material of each of the cushioning components 150 is, for example, rubber or other kinds of buffer materials, which is not limited in the disclosure.

Specifically, the speaker 124 of the embodiment includes a speaker body 1241 and an extending portion 1242, and the extending portion 1242 extends along a periphery of the speaker body 1241. The cushioning component 160 is annular in shape and is disposed between the extending portion 1242 and the speaker box 122 and surrounds the speaker body 1241. As shown in FIG. 12, the cushioning component 160 and the extending portion 1242 may be passed through by a fastener S3 (e.g., a screw) to lock the extending portion 1242 to a screw hole 122a of the speaker box 122. The extending portion 1242 may be assembled to the speaker box 122 in other ways, and the disclosure is not limited thereto. The cushioning component 170 is also annular in shape and surrounds the speaker 124. In other embodiments, the cushioning component 160 and the cushioning component 170 may be other suitable shapes, which is not limited in the disclosure.

As described above, the cushioning component 150 is disposed between the second housing 114 and the first housing 112, the cushioning component 160 is disposed between the speaker box 122 and the speaker 124, and the cushioning component 170 is disposed between the speaker box 122 and the first housing 112. Therefore, the speaker 124 and the circuit board 130 are blocked by the cushioning component 160, the speaker box 122, the cushioning component 170, the first housing 112, the cushioning component 150, and the second housing 114. A long enough vibration transmission path is formed, so that it is difficult for the vibration of the speaker 124 to be transmitted to the microphone 140 on the circuit board 130. In addition, by stacking the above-mentioned multiple components, a distance between the speaker 124 and the circuit board 130 in a perpendicular direction is increased. For example, the cushioning component 150 supports the second housing 114 above the first housing 112 in a perpendicular direction, thereby increasing a distance between the microphone module and the microphone 140 thereof and the speaker module 120 in the perpendicular direction. The cushioning component 150 supports the speaker box 122 above the speaker 124 in a perpendicular direction, thereby increasing a distance between the microphone 140 and the speaker 124 in the perpendicular direction. This also helps to reduce the impact of the vibration of the speaker 124 on the microphone 140 on the circuit board 130.

On the other hand, in this embodiment, the electric module 115 of the smart speaker 100 further includes an image capturer 180. The image capturer 180 is disposed in the second housing 114 and coupled to the circuit board 130 for providing a camera function. By disposing multiple components in a stacked manner as described above, the position of the image capturer 180 at the second housing 114 may be higher, so that the image capturer 180 may have a better camera field of view.

To sum up, in the smart speaker of the disclosure, a microphone module including a microphone and a circuit board is assembled in a second housing instead of a first housing. In addition, a cushioning component may be disposed between the second housing and the first housing, a cushioning component may be disposed between the speaker box and the speaker, and a cushioning component may be disposed between the speaker box and the first housing. Accordingly, in response to the speaker module disposed in the first housing being actuated, which vibrates the speaker box, the vibration is not directly transmitted to the microphone of the microphone module through the first housing. Thus, the audio-receiving effect of the microphone module is not affected by excessive vibration of the speaker box.

What is claimed is:

1. A smart speaker adapted to operate independently and used for voice commands and audio content playback, comprising:
   an outer casing, comprising a first housing and a second housing assembled to each other;
   a speaker module, disposed in the first housing; and
   a microphone module, comprising a circuit board and at least one microphone, wherein the circuit board is assembled in the second housing and separated from the first housing, and the at least one microphone is disposed on the circuit board.

2. The smart speaker according to claim 1, wherein the circuit board comprises an upper surface and a lower surface opposite to each other, the lower surface faces the speaker module, and the at least one microphone is disposed on the lower surface.

3. The smart speaker according to claim 1, comprising at least one cushioning component, wherein the at least one cushioning component is disposed between the second housing and the first housing.

4. The smart speaker according to claim 3, wherein the second housing comprises a plurality of assembling portions and is assembled in the first housing by the assembling portions, a number of the at least one cushioning component is multiple, and the cushioning components correspond respectively to the assembling portions.

5. The smart speaker according to claim 4, wherein the assembling portions surround the circuit board.

6. The smart speaker according to claim 3, wherein the at least one cushioning component supports the second housing above the first housing in a perpendicular direction, thereby increasing a distance between the at least one microphone and the speaker module in the perpendicular direction.

7. The smart speaker according to claim 1, wherein the speaker module comprises a speaker box and a speaker, and the speaker is disposed in the speaker box.

8. The smart speaker according to claim 7, comprising a cushioning component, wherein the cushioning component is disposed between the speaker box and the speaker.

9. The smart speaker according to claim 8, wherein the speaker comprises a speaker body and an extending portion, the extending portion extends along a periphery of the speaker body, and the cushioning component is disposed between the extending portion and the speaker box and surrounds the speaker body.

10. The smart speaker according to claim 8, wherein the cushioning component supports the speaker box above the speaker in a perpendicular direction, thereby increasing a distance between the at least one microphone and the speaker in the perpendicular direction.

11. The smart speaker according to claim 7, comprising a cushioning component, wherein the cushioning component is disposed between the speaker box and the first housing.

12. The smart speaker according to claim 11, wherein the cushioning component surrounds the speaker.

13. The smart speaker according to claim 1, comprising an image capturer, wherein the image capturer is disposed in the second housing.

* * * * *